(12) United States Patent
Tan

(10) Patent No.: US 10,558,253 B2
(45) Date of Patent: Feb. 11, 2020

(54) ENERGY MONITORING METHODS AND BATTERY DEVICES

(71) Applicant: RAZER (ASIA-PACIFIC) PTE. LTD., Singapore (SG)

(72) Inventor: Min-Liang Tan, Singapore (SG)

(73) Assignee: RAZER (ASIA-PACIFIC) PTE. LTD., Singapore (SG)

( * ) Notice: Subject to any disclaimer, the term of this patent is extended or adjusted under 35 U.S.C. 154(b) by 167 days.

(21) Appl. No.: 15/538,601

(22) PCT Filed: Dec. 23, 2014

(86) PCT No.: PCT/SG2014/000612
§ 371 (c)(1),
(2) Date: Jun. 21, 2017

(87) PCT Pub. No.: WO2016/105273
PCT Pub. Date: Jun. 30, 2016

(65) Prior Publication Data
US 2017/0351317 A1    Dec. 7, 2017

(51) Int. Cl.
*G06F 1/26* (2006.01)
*G06F 1/32* (2019.01)
(Continued)

(52) U.S. Cl.
CPC ....... *G06F 1/3212* (2013.01); *G01R 31/3648* (2013.01); *G06F 1/263* (2013.01);
(Continued)

(58) Field of Classification Search
CPC ...................................... G06F 1/26; G06F 1/32
See application file for complete search history.

(56) References Cited

U.S. PATENT DOCUMENTS 5,557,188 A * 9/1996 Piercey ................. H02J 7/0004
320/134
5,596,567 A    1/1997 deMuro et al.
(Continued)

FOREIGN PATENT DOCUMENTS

CN    202550660 U    11/2012
CN    202888880 U    4/2013
(Continued)

OTHER PUBLICATIONS

Rao et al., "Battery Modeling for Energy-Aware System Design," IEEE Computer, vol. 36, issue 12, Dec. 2003 , pp. 77-87.
(Continued)

*Primary Examiner* — Phil K Nguyen
(74) *Attorney, Agent, or Firm* — Polsinelli PC

(57) ABSTRACT

According to various embodiments, an energy monitoring method may be provided. The energy monitoring method may include: determining internal energy information indicating a charge state of an internal battery of a computing device; wirelessly receiving external energy information indicating a charge state of an external battery for the computing device; determining a combined energy information indicating a combined charge state of the internal battery and external battery based on the internal energy information and based on the external energy information; and providing a notification to a user of the computing device based on the combined energy information.

16 Claims, 5 Drawing Sheets

(51) Int. Cl.
*G06F 1/3212* (2019.01)
*H04W 52/02* (2009.01)
*G01R 31/36* (2019.01)
*H02J 7/00* (2006.01)
*H01M 10/48* (2006.01)
*G01R 31/382* (2019.01)

(52) U.S. Cl.
CPC ....... *H02J 7/0047* (2013.01); *H04W 52/0296* (2013.01); *G01R 31/382* (2019.01); *H01M 10/48* (2013.01); *H04W 52/0258* (2013.01); *Y02D 10/174* (2018.01); *Y02D 70/00* (2018.01); *Y02D 70/20* (2018.01); *Y02D 70/26* (2018.01)

(56) References Cited

U.S. PATENT DOCUMENTS

| | | |
|---|---|---|
| 5,982,147 A * | 11/1999 | Anderson ............. H02J 7/0004 320/132 |
| 6,249,124 B1 | 6/2001 | Bertness |
| 6,271,643 B1 | 8/2001 | Becker et al. |
| 6,831,444 B2 | 12/2004 | Kobayashi et al. |
| 7,636,042 B2 | 12/2009 | Hameed |
| 7,765,419 B2 | 7/2010 | Fuccello |
| 7,774,151 B2 | 8/2010 | Bertness |
| 7,861,099 B2 | 12/2010 | Theocharous et al. |
| 8,024,012 B2 | 9/2011 | Clevenger et al. |
| 8,090,415 B2 | 1/2012 | Annambhotla et al. |
| 8,200,292 B2 | 6/2012 | Wu et al. |
| 2002/0069259 A1 * | 6/2002 | Kushwaha ............. H04L 41/046 709/217 |
| 2006/0250233 A1 * | 11/2006 | Powell ............... G01R 31/3648 340/539.1 |
| 2007/0001680 A1 | 1/2007 | Khoo |
| 2007/0188145 A1 * | 8/2007 | Kim .................. H04M 1/72519 320/132 |
| 2007/0188148 A1 * | 8/2007 | Kawasumi ............. H01M 2/34 320/134 |
| 2007/0285056 A1 * | 12/2007 | Yoon ....................... G06F 1/263 320/116 |
| 2008/0263375 A1 | 10/2008 | Sundstrom et al. |
| 2010/0156343 A1 * | 6/2010 | Jung ....................... H02J 7/025 320/108 |
| 2010/0207575 A1 * | 8/2010 | Pijnenburg ............. H02J 7/022 320/108 |
| 2011/0016333 A1 | 1/2011 | Scott et al. |
| 2011/0181399 A1 * | 7/2011 | Pollack ............. G06K 19/0707 340/10.33 |
| 2011/0207509 A1 | 8/2011 | Crawford |
| 2012/0104997 A1 | 5/2012 | Carobolante |
| 2013/0002442 A1 | 1/2013 | Guthrie |
| 2013/0009782 A1 | 1/2013 | Brandt et al. |
| 2013/0043730 A1 | 2/2013 | Claise et al. |
| 2013/0076137 A1 | 3/2013 | Murtha et al. |
| 2013/0086409 A1 * | 4/2013 | Lu ....................... H04L 12/2807 713/340 |
| 2013/0088192 A1 * | 4/2013 | Eaton ..................... G06F 1/266 320/108 |
| 2013/0103960 A1 | 4/2013 | Alberth et al. |
| 2013/0278204 A1 * | 10/2013 | Howard ................ H02J 7/0054 320/107 |
| 2013/0326237 A1 * | 12/2013 | Holdengreber ........... G06F 1/26 713/300 |
| 2014/0082383 A1 * | 3/2014 | De Cesare ............ G06F 1/3206 713/320 |
| 2014/0117921 A1 * | 5/2014 | Suomela .............. H04B 5/0031 320/103 |
| 2014/0141838 A1 * | 5/2014 | Cai ................... H04M 1/72575 455/557 |
| 2014/0195826 A1 * | 7/2014 | Wojcik ................. H05K 5/0086 713/300 |
| 2014/0229129 A1 | 8/2014 | Campbell et al. |
| 2014/0344588 A1 * | 11/2014 | Chou ....................... G06F 1/30 713/300 |
| 2015/0133189 A1 * | 5/2015 | Mukae .................. H04W 84/06 455/556.1 |
| 2015/0293575 A1 * | 10/2015 | Hampson .............. G06F 1/3212 713/323 |

FOREIGN PATENT DOCUMENTS

| | | |
|---|---|---|
| EP | 1819135 A2 | 8/2007 |
| EP | 2282494 A1 | 2/2011 |
| JP | 2009-118440 A | 5/2009 |
| JP | 2011-18560 A | 1/2011 |
| JP | 2012-70566 A | 4/2014 |
| KR | 20080053725 A | 6/2008 |
| TW | 201201476 A1 | 1/2012 |
| WO | 99/43095 A1 | 8/1999 |

OTHER PUBLICATIONS

Herrmann et al., "Context Aware Power Management of Mobile Systems for Sensing Applications," In: Proceedings of the conference on information processing in sensor networks, Beijing, China, Apr. 16-20, 2012, pp. 1-5. New York: ACM.

Extended European Search Report dated Jul. 2, 2018, 11 pages, for the corresponding European Patent Application No. 14909183.7.

* cited by examiner

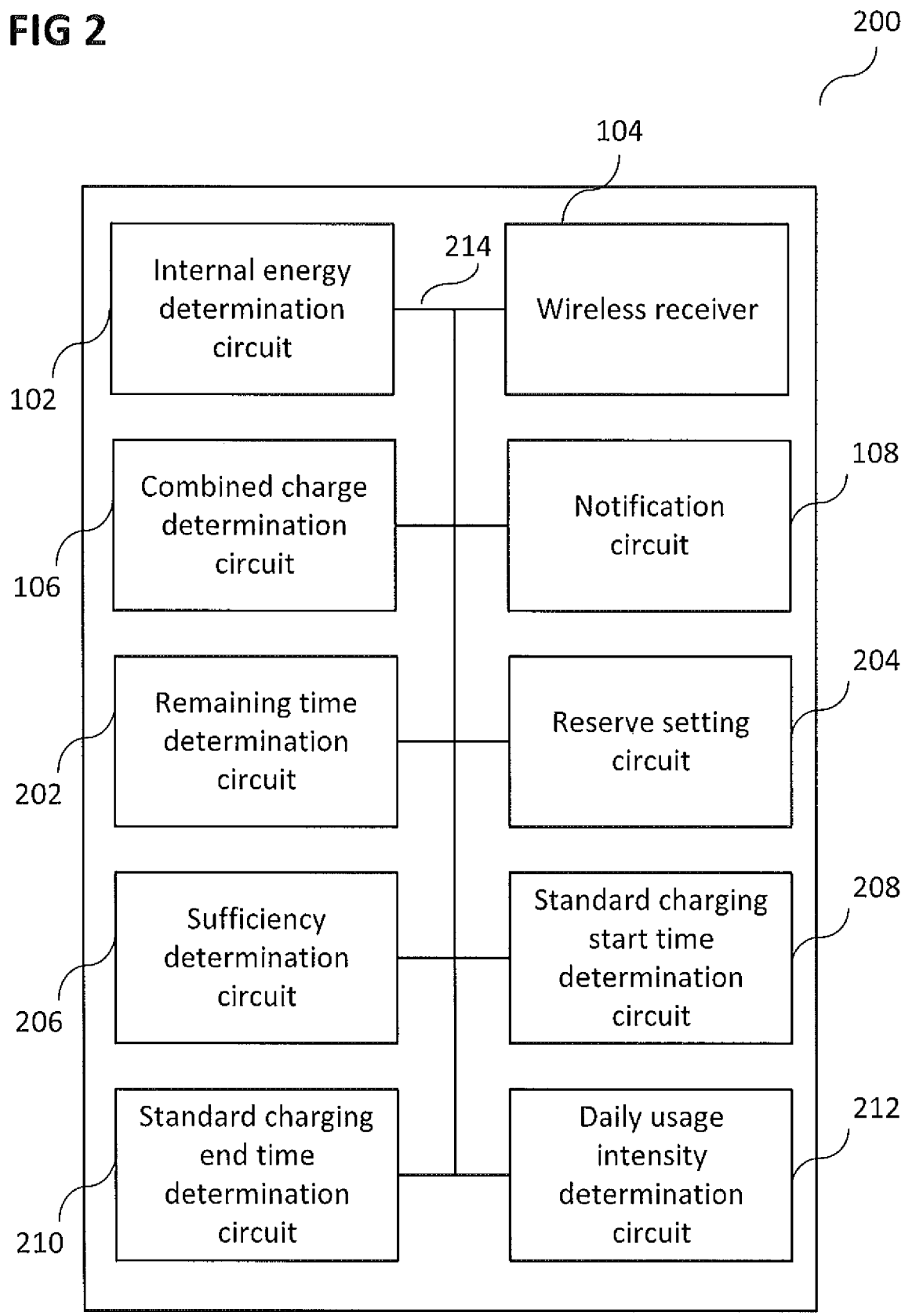

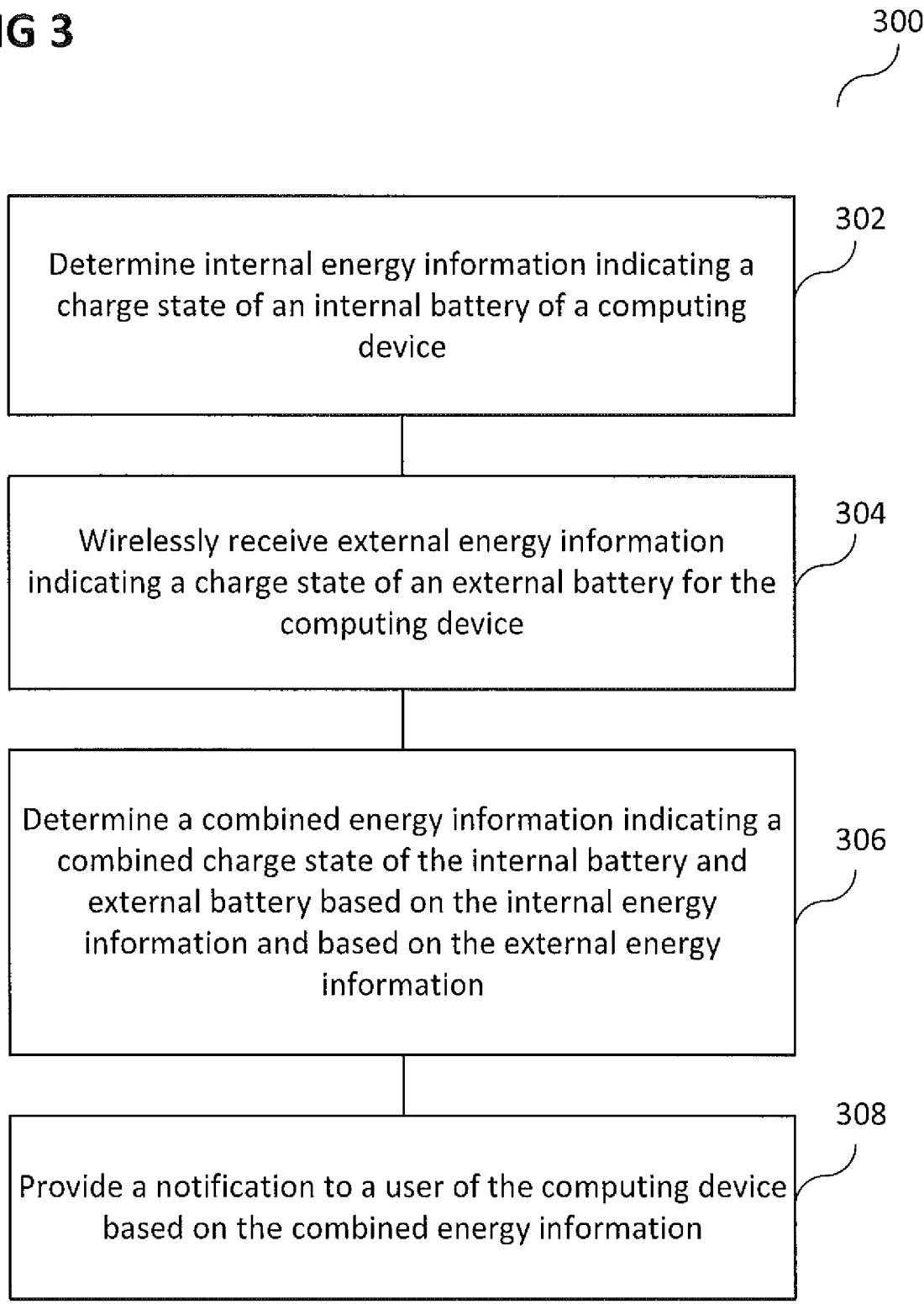

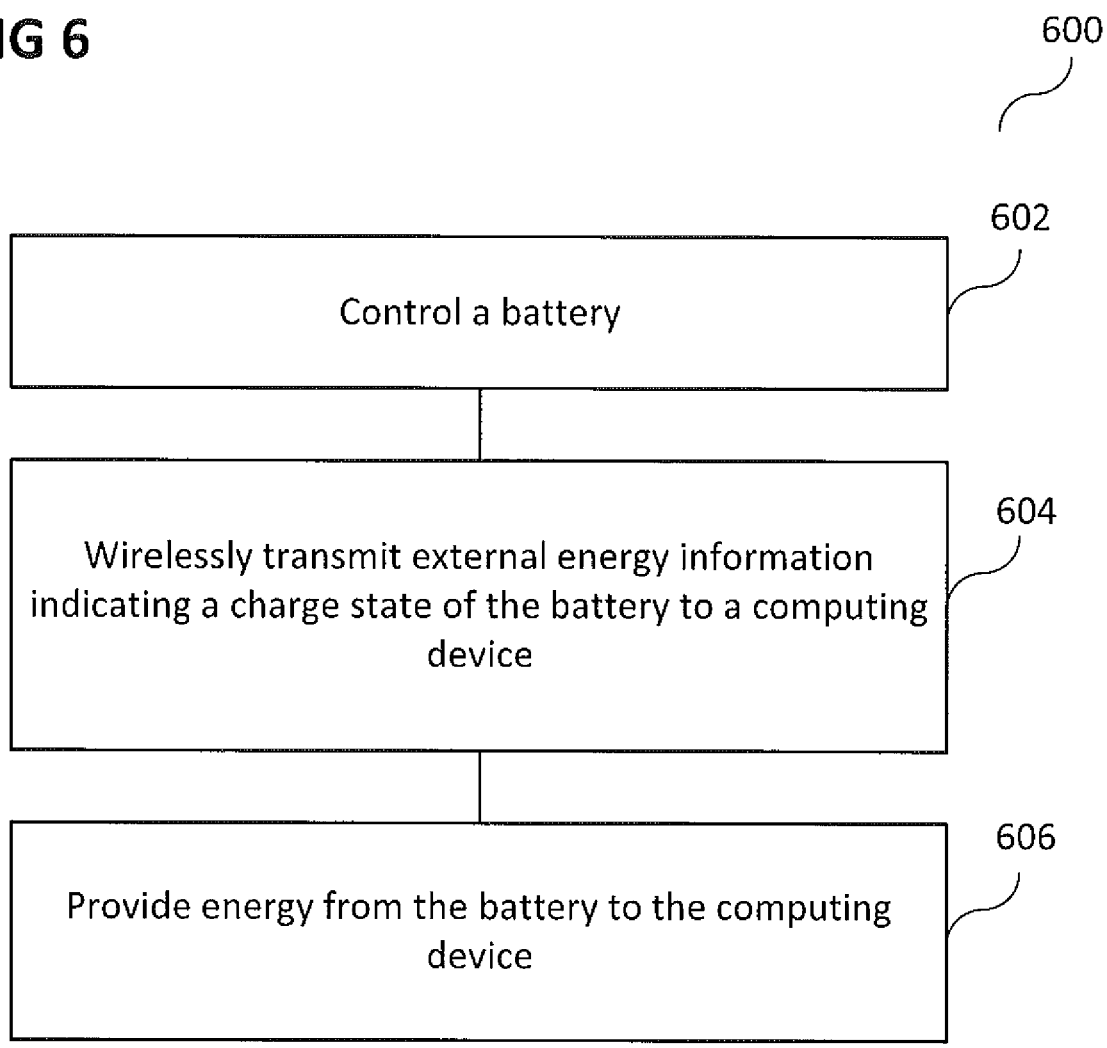

ENERGY MONITORING METHODS AND BATTERY DEVICES

TECHNICAL FIELD

Various embodiments generally relate to energy monitoring methods and battery devices.

BACKGROUND

Smart phones and other portable electronics devices frequently run out of battery. Thus, there may be a need for devices and methods which ensure that the smart phones or other portable electronics devices are provided with sufficient battery power.

SUMMARY OF THE INVENTION

According to various embodiments, an energy monitoring method may be provided. The energy monitoring method may include: determining internal energy information indicating a charge state of an internal battery of a computing device; wirelessly receiving external energy information indicating a charge state of an external battery for the computing device; determining a combined energy information indicating a combined charge state of the internal battery and external battery based on the internal energy information and based on the external energy information; and providing a notification to a user of the computing device based on the combined energy information.

According to various embodiments, a battery device may be provided. The battery device may include: a battery, wherein the battery is the external battery from which the external energy information is received wirelessly according in the energy monitoring method described above; and a wireless transmitter configured to wirelessly transmit the external energy information.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. The dimensions of the various features or elements may be arbitrarily expanded or reduced for clarity. In the following description, various embodiments of the invention are described with reference to the following drawings, in which:

FIG. 2 shows an energy monitoring device according to various embodiments;

FIG. 3 shows a flow diagram illustrating an energy monitoring method according to various embodiments;

FIG. 6 shows a flow diagram illustrating a method for controlling a battery device according to various embodiments.

DETAILED DESCRIPTION

Figure 1:
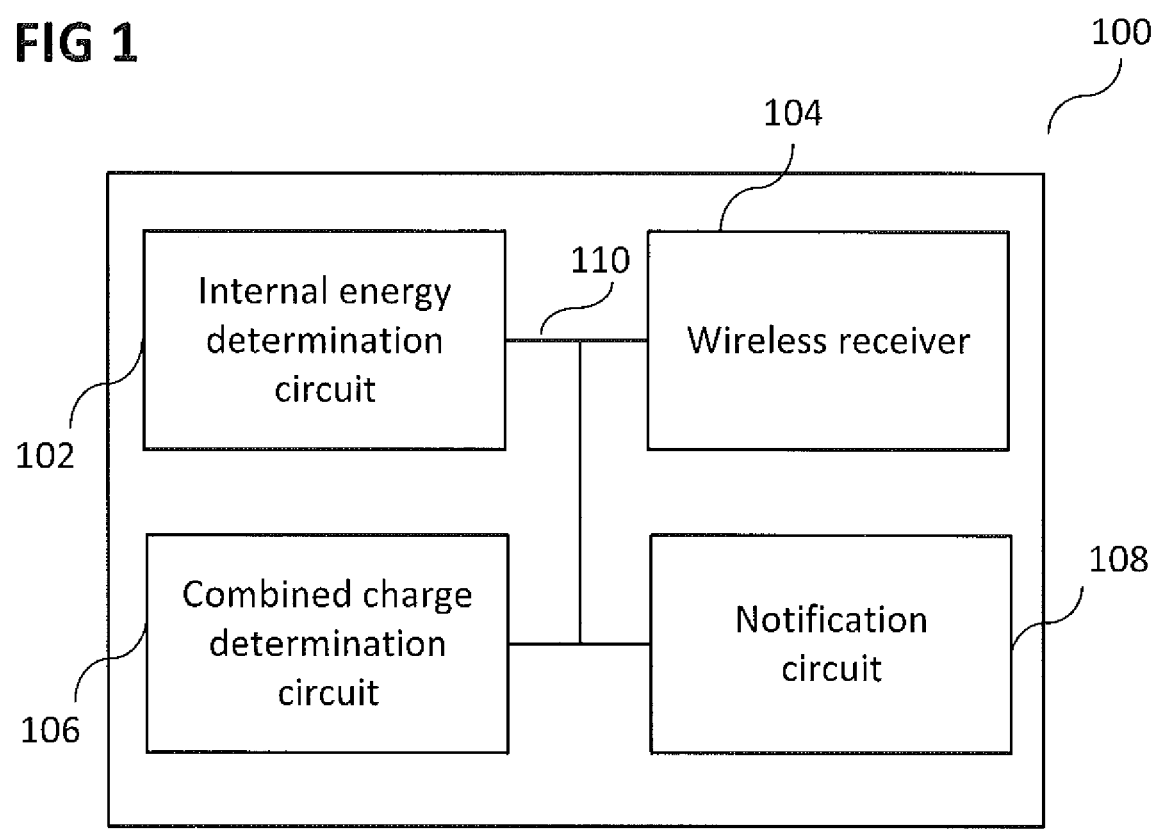
FIG. 1 shows an energy monitoring device according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In this context, the energy monitoring device as described in this description may include a memory which is for example used in the processing carried out in the energy monitoring device. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

In the specification the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

The reference to any prior art in this specification is not, and should not be taken as an acknowledgement or any form of suggestion that the referenced prior art forms part of the common general knowledge in Australia (or any other country).

In order that the invention may be readily understood and put into practical effect, particular embodiments will now be described by way of examples and not limitations, and with reference to the figures.

Various embodiments are provided for devices, and various embodiments are provided for methods. It will be understood that basic properties of the devices also hold for the methods and vice versa. Therefore, for sake of brevity, duplicate description of such properties may be omitted.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

The term "coupled" (or "connected") herein may be understood as electrically coupled or as mechanically coupled, for example attached or fixed or attached, or just in contact without any fixation, and it will be understood that both direct coupling or indirect coupling (in other words: coupling without direct contact) may be provided.

Smart phones and other portable electronics devices frequently run out of battery. According to various embodiments, devices and methods may be provided which ensure that the smart phones or other portable electronics devices are provided with sufficient battery power.

While external battery packs (for example energy wearables) are being used, the user may often forget to charge them or may be unaware of the actual amount of charging required.

According to various embodiments, devices and methods may be provided for a dynamic power management of a portable battery pack and a mobile communication device. According to various embodiments, devices and methods may be provided for smart energy management of wearable devices.

FIG. 1 shows an energy monitoring device 100 according to various embodiments. The energy monitoring device 100 may include an internal energy determination circuit 102 configured to determine internal energy information indicating a charge state of an internal battery of a computing device. The energy monitoring device 100 may further include a wireless receiver 104 configured to wirelessly receive external energy information indicating a charge state of an external battery for the computing device. The energy monitoring device 100 may further include a combined charge determination circuit 106 configured to determine a combined energy information indicating a combined charge state of the internal battery and external battery based on the internal energy information and based on the external energy information. The energy monitoring device 100 may further include a notification circuit 108 configured to provide a notification to a user of the computing device based on the combined energy information. The internal energy determination circuit 102, the wireless receiver 104, the combined charge determination circuit 106, and the notification circuit 108 may be coupled with each other, like indicated by lines 110, for example electrically coupled, for example using a line or a cable, and/or mechanically coupled.

In other words, according to various embodiments, an energy monitoring device may be provided, which may notify a user of a computing device based on a total charge (or electric power) available in an internal battery of the computing device and an external battery (which may be external to the computing device).

FIG. 2 shows an energy monitoring device 200 according to various embodiments. The energy monitoring device 200 may, similar to the energy monitoring device 100 of FIG. 1, include an internal energy determination circuit 102 configured to determine internal energy information indicating a charge state of an internal battery of a computing device. The energy monitoring device 200 may, similar to the energy monitoring device 100 of FIG. 1, further include a wireless receiver 104 configured to wirelessly receive external energy information indicating a charge state of an external battery for the computing device. The energy monitoring device 200 may, similar to the energy monitoring device 100 of FIG. 1, further include a combined charge determination circuit 106 configured to determine a combined energy information indicating a combined charge state of the internal battery and external battery based on the internal energy information and based on the external energy information. The energy monitoring device 200 may, similar to the energy monitoring device 100 of FIG. 1, further include a notification circuit 108 configured to provide a notification to a user of the computing device based on the combined energy information. The energy monitoring device 200 may further include a remaining time determination circuit 202, like will be described in more detail below. The energy monitoring device 200 may further include a reserve setting circuit 204, like will be described in more detail below. The energy monitoring device 200 may further include a sufficiency determination circuit 206, like will be described in more detail below. The energy monitoring device 200 may further include a standard charging start time determination circuit 208, like will be described in more detail below. The energy monitoring device 200 may further include a standard charging end time determination circuit 210, like will be described in more detail below. The energy monitoring device 200 may further include a daily usage intensity determination circuit 212, like will be described in more detail below. The internal energy determination circuit 102, the wireless receiver 104, the combined charge determination circuit 106, the notification circuit 108, the remaining time determination circuit 202, the reserve setting circuit 204, the sufficiency determination circuit 206, the standard charging start time determination circuit 208, the standard charging end time determination circuit 210, and the daily usage intensity determination circuit 212 may be coupled with each other, like indicated by lines 214, for example electrically coupled, for example using a line or a cable, and/or mechanically coupled.

According to various embodiments, the remaining time determination circuit 202 may be configured to determine based on the combined energy a remaining time information indicating a remaining run time during which the internal battery and the external battery provide energy to the computing device.

According to various embodiments, the reserve setting circuit 204 may be configured to set a battery life reserve time indicating a desired duration for which the internal battery and the external battery are to provide energy to the computing device.

According to various embodiments, the sufficiency determination circuit 206 may be configured to determine whether the remaining run time is shorter than the desired duration.

According to various embodiments, the notification circuit 108 may further be configured to provide a warning notification to the user of the computing device if the sufficiency determination circuit determines that the remaining run time is shorter than the desired duration.

According to various embodiments, the standard charging start time determination circuit 208 may be configured to determine a daily time at which usually the user starts charging of at least one of the external battery or the internal battery.

According to various embodiments, the reserve setting circuit 204 may be configured to set, based on the daily time at which usually the user starts the charging, a battery life reserve time indicating a desired duration for which the internal battery and the external battery are to provide energy to the computing device.

According to various embodiments, the standard charging end time determination circuit 210 may be configured to determine a daily time at which usually the user ends charging of at least one of the external battery or the internal battery.

According to various embodiments, the reserve setting circuit 204 may be configured to set, based on the daily time at which usually the user ends the charging, a battery life reserve time indicating a desired duration for which the internal battery and the external battery are to provide energy to the computing device.

According to various embodiments, the daily usage intensity determination circuit 212 may be configured to determine a history of power consumption over pre-determined periods of a day.

According to various embodiments, the reserve setting circuit 204 may be configured to set, based on the history, a battery life reserve time indicating a desired duration for which the internal battery and the external battery are to provide energy to the computing device.

According to various embodiments, the external battery may be provided in a battery pack.

According to various embodiments, the energy monitoring device 200 may be provided in the computing device.

According to various embodiments, the computing device may be a smart phone.

According to various embodiments, the energy monitoring device 200 may be provided separate from the computing device. According to various embodiments, the wireless receiver 104 may further be configured to receive the internal energy information.

According to various embodiments, the energy monitoring device 200 may be a wearable device.

FIG. 3 shows a flow diagram 300 illustrating an energy monitoring method according to various embodiments. In 302, internal energy information indicating a charge state of an internal battery of a computing device may be determined. In 304, external energy information indicating a charge state of an external battery for the computing device may be received wirelessly. In 306, a combined energy information indicating a combined charge state of the internal battery and external battery may be determined based on the internal energy information and based on the external energy information. In 308, a notification may be provided to a user of the computing device based on the combined energy information.

According to various embodiments, energy monitoring method may further include determining based on the combined energy a remaining time information indicating a remaining run time during which the internal battery and the external battery provide energy to the computing device.

According to various embodiments, energy monitoring method may further include setting a battery life reserve time indicating a desired duration for which the internal battery and the external battery are to provide energy to the computing device.

According to various embodiments, energy monitoring method may further include determining whether the remaining run time is shorter than the desired duration.

According to various embodiments, energy monitoring method may further include providing a warning notification to the user of the computing device if the sufficiency determination circuit determines that the remaining run time is shorter than the desired duration.

According to various embodiments, energy monitoring method may further include determining a daily time at which usually the user starts charging of at least one of the external battery or the internal battery.

According to various embodiments, energy monitoring method may further include setting, based on the daily time at which usually the user starts the charging, a battery life reserve time indicating a desired duration for which the internal battery and the external battery are to provide energy to the computing device.

According to various embodiments, energy monitoring method may further include determining a daily time at which usually the user ends charging of at least one of the external battery or the internal battery.

According to various embodiments, energy monitoring method may further include determining a history of power consumption over pre-determined periods of a day.

According to various embodiments, energy monitoring method may further include setting, based on the history, a battery life reserve time indicating a desired duration for which the internal battery and the external battery are to provide energy to the computing device.

According to various embodiments, the external battery may be provided in a battery pack.

According to various embodiments, the energy monitoring method may be carried out in the computing device.

According to various embodiments, the computing device may be a smart phone.

According to various embodiments, the energy monitoring method may be carried out in a device separate from the computing device.

According to various embodiments, the energy monitoring method may be carried out in a wearable device.

According to various embodiments, a battery device may be provided. The battery device may include: a battery, wherein the battery is the external battery from which the external energy information is received wirelessly in an energy monitoring method (for example the energy monitoring method like described above with reference to FIG. 3); and a wireless transmitter configured to wirelessly transmit the external energy information.

Figure 4:
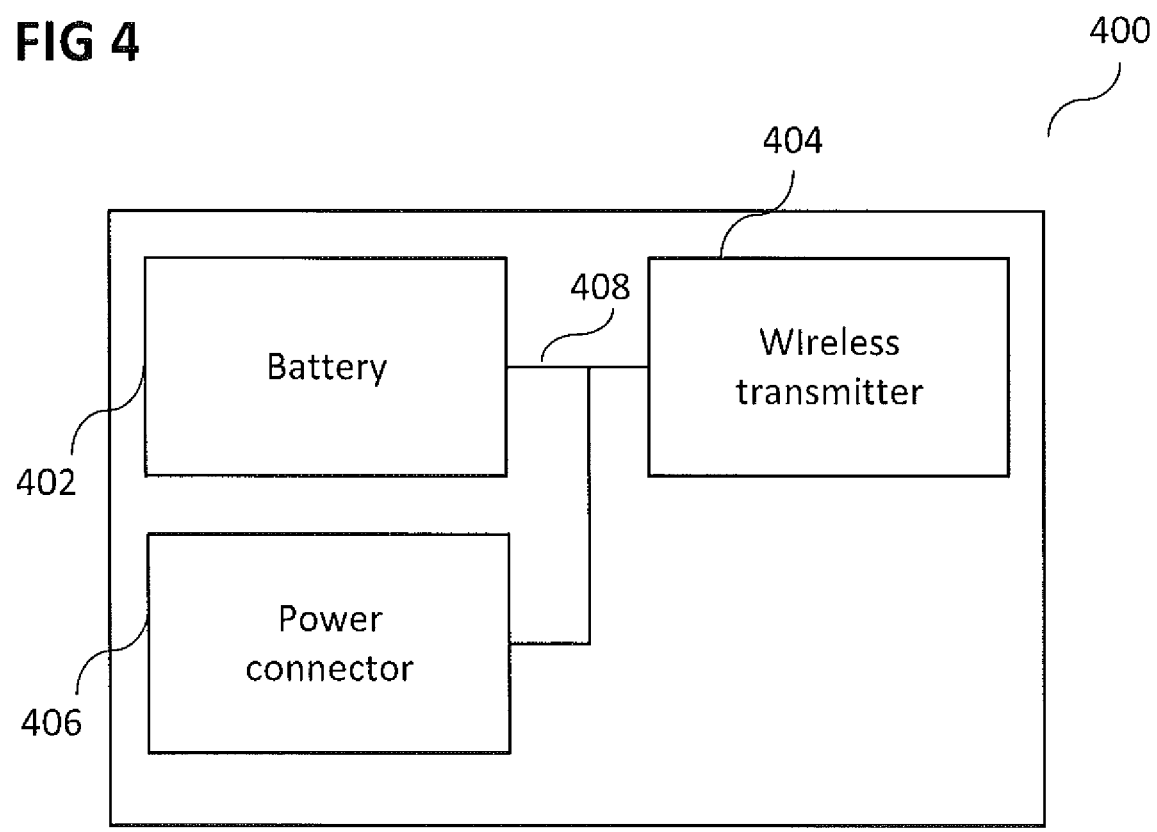
FIG. 4 shows a battery device according to various embodiments.

FIG. 4 shows a battery device 400 according to various embodiments. The battery device 400 may include a battery 402. The battery device 400 may further include a wireless transmitter 404 configured to wirelessly transmit external energy information indicating a charge state of the battery 402 to a computing device (not shown in FIG. 4). The battery device 400 may further include a power connector 406 configured to provide energy from the battery 402 to the computing device. The battery 402, the wireless transmitter 404, and the power connector 406 may be coupled with each other, like indicated by lines 408, for example electrically coupled, for example using a line or a cable, and/or mechanically coupled.

Figure 5:
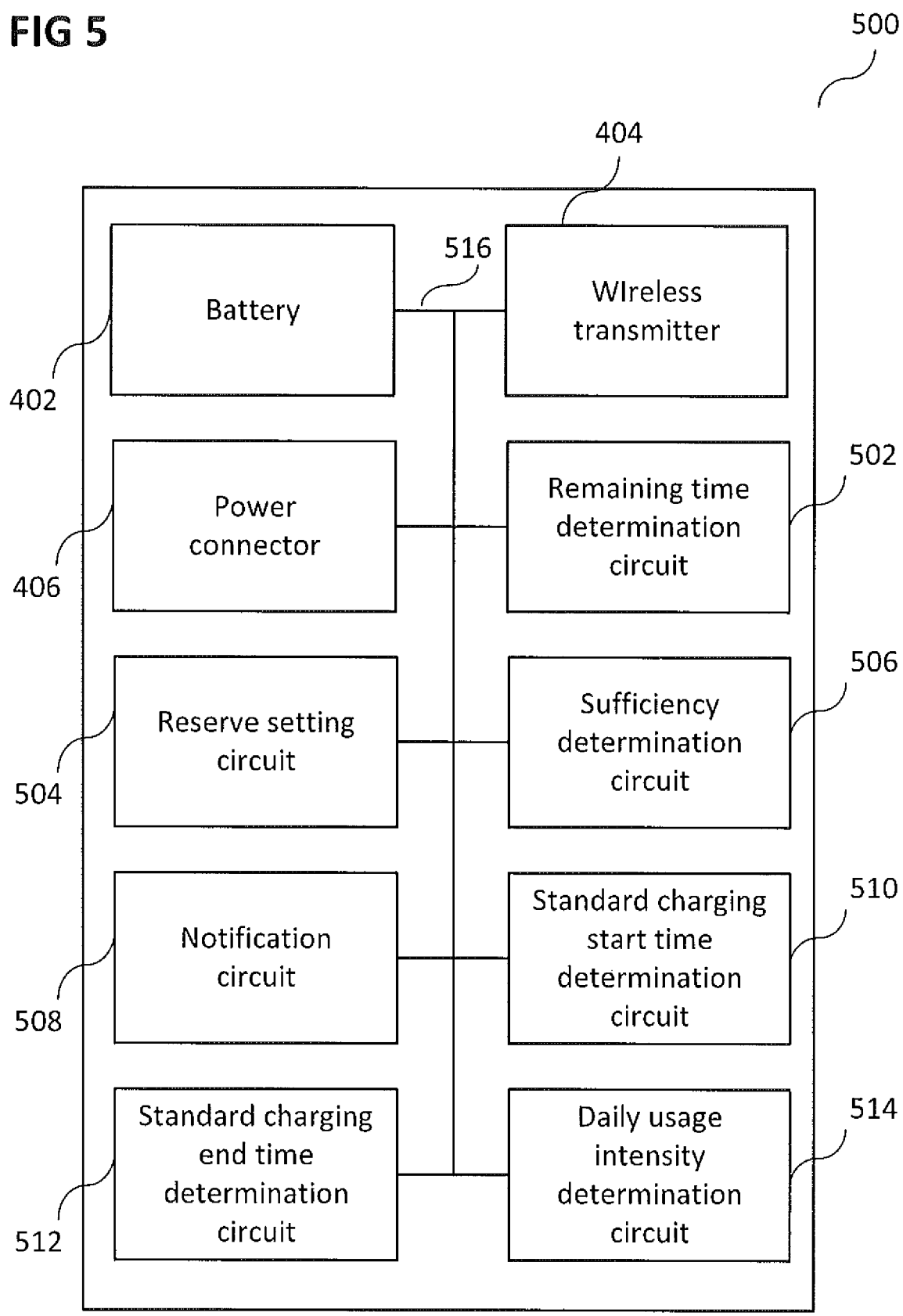
FIG. 5 shows a battery device according to various embodiments.

FIG. 5 shows a battery device 500 according to various embodiments. The battery device 500 may, similar to the battery device 400 described above with reference to FIG. 4, include a battery 402. The battery device 500 may, similar to the battery device 400 described above with reference to FIG. 4, further include a wireless transmitter 404 configured to wirelessly transmit external energy information indicating a charge state of the battery 402 to a computing device (not shown in FIG. 5). The battery device 500 may, similar to the battery device 400 described above with reference to FIG. 4, may further include a power connector 406 configured to provide energy from the battery 402 to the computing device. The battery device 500 may further include a remaining time determination circuit 502, like will be described in more detail below. The battery device 500 may further include a reserve setting circuit 504, like will be described in more detail below. The battery device 500 may further include a sufficiency determination circuit 506, like will be described in more detail below. The battery device 500 may further include a notification circuit 508, like will be described in more detail below. The battery device 500 may further include a standard charging start time determination circuit 510, like will be described in more detail below. The battery device 500 may further include a standard charging end time determination circuit 510, like will be described in more detail below. The battery device 500 may further include a daily usage intensity determination circuit 514, like will be described in more detail below. The battery 402, the wireless transmitter 404, the power connector 406, the remaining time determination circuit 502, the reserve setting circuit 504, the sufficiency determination circuit 506, the notification circuit 508, the standard charging start time determination circuit 510, the standard charging end time determination circuit 510, and the daily usage intensity determination circuit 514 may be coupled with each other, like indicated by lines 516, for example electrically coupled, for example using a line or a cable, and/or mechanically coupled.

According to various embodiments, the remaining time determination circuit 502 may be configured to determine a remaining time information indicating a remaining run time during which the battery 402 provides energy to the computing device.

According to various embodiments, the reserve setting circuit 504 may be configured to set a battery life reserve time indicating a desired duration for which the battery 402 is to provide energy to the computing device.

According to various embodiments, the sufficiency determination circuit 506 may be configured to determine whether the remaining run time is shorter than the desired duration.

According to various embodiments, the notification circuit 508 may be to provide (for example via a wireless transmission to the computing device) a warning notification to the user of the computing device if the sufficiency determination circuit determines that the remaining run time is shorter than the desired duration.

According to various embodiments, the standard charging start time determination circuit 510 may be configured to determine a daily time at which usually the user starts charging of the battery 402.

According to various embodiments, the reserve setting circuit 504 may be configured to set, based on the daily time at which usually the user starts the charging, a battery life reserve time indicating a desired duration for which the battery 402 is to provide energy to the computing device.

According to various embodiments, the standard charging end time determination circuit 512 may be configured to determine a daily time at which usually the user ends charging of battery 402.

According to various embodiments, the daily usage intensity determination circuit 514 may be configured to determine a history of power consumption over pre-determined periods of a day.

According to various embodiments, the reserve setting circuit 504 may be configured to set, based on the history, a battery life reserve time indicating a desired duration for which the battery 402 is to provide energy to the computing device.

According to various embodiments, the battery device may be provided separate from the computing device.

According to various embodiments, the power connector may include a universal serial bus connector.

FIG. 6 shows a flow diagram 600 illustrating a method for controlling a battery device according to various embodiments. In 602, a battery may be controlled. In 604, external energy information indicating a charge state of the battery may be wirelessly transmitted to a computing device. In 606, energy may be provided from the battery to the computing device.

According to various embodiments, a computer-readable medium may be provided. The computer-readable medium may include program instructions which when executed by a processor cause the processor to perform an energy monitoring, for example the energy monitoring method like described above with reference to FIG. 3.

According to various embodiments, a server may be provided. The server may include a downloadable program which includes program instructions which when downloaded and executed by a processor cause the processor to perform an energy monitoring, for example the energy monitoring method like described above with reference to FIG. 3.

According to various embodiments, a downloadable application (in other words: an app) may be provided which may perform an energy monitoring, for example the energy monitoring method like described above with reference to FIG. 3

According to various embodiments, devices and methods of dynamically monitoring battery life in a portable battery pack/energy wearables and a mobile communication device may be provided. For example, the method may include the following steps:

1) Receiving battery life data wirelessly from an external battery pack (or energy wearable);
2) Monitoring existing battery life of a smartphone battery in real time;
3) Calculating battery drawdown of smartphone battery;
4) Setting a predefined smartphone battery life reserve in number of hours;
5) Determining if the combined existing smartphone battery life and battery life data of external battery pack is less than predefined smartphone battery life; and
6) Alerting the user of the smartphone battery life status when 5) occurs.

According to various embodiments, a dynamic monitoring method or a dynamic monitoring device or a dynamic monitoring application (or app) may be provided which may be wirelessly linked to the smartphone and the external battery pack/wearable.

According to various embodiments, the smartphone may have an energy monitoring device or an energy monitoring app installed.

According to various embodiments, an external battery pack may be able to know the amount of battery life it has and may be able to provide the data.

According to various embodiments, the energy monitoring device or energy monitoring app may be linked to the external battery pack wirelessly.

According to various embodiments, the energy monitoring device or energy monitoring app may have information of the existing battery power on the smartphone as well as on the external battery pack.

According to various embodiments, the energy monitoring device or energy monitoring app may be able to calculate the amount of battery draw by the smart phone.

According to various embodiments, the energy monitoring device or energy monitoring app may be pre-defined to always provide for a pre-determined amount of time (for example "x" hours, where x may be a pre-determined number) of battery life for the smartphone. For example, the energy monitoring device or energy monitoring app may calculate the amount of battery required for the pre-determined period of time (for example x hours) for the smart phone and may combine available battery life for both the smartphone and the external battery pack to alert the user if the predefined hours of battery life falls below the requirement. For example, the user can state: "Always have at least 8 hours of battery life"; then, if the combined battery life of the smart phone and the external battery pack goes lower than 8 hours, the user may be alerted via the energy monitoring device or app.

According to various embodiments, the energy monitoring device or energy monitoring app may learn the charging patterns of the user. For example, the user may usually charge its smart phone and/or battery back at pre-determined points of time (for example every night at 10 pm) and goes off charging at other pre-determined points of time (for example 9 am in the morning). The energy monitoring device or energy monitoring app may alert the user if the combined battery life of the smartphone and external battery pack falls below the usual pattern. For example, the average time that the user charges his phone for the past 7 days may be at 10 pm and the average time the user takes the phone off charging is at 9 am and the phone knows it needs to have a total battery life of 9 am to 10 pm for the phone and battery pack combined. The energy monitoring device or app may alert the user when he is likely to run out of battery or if he needs to charge his external battery pack or both.

According to various embodiments, external battery packs for mobile communication or computing devices or energy wearables which may be wearable devices that act as external battery packs for mobile communication or computing devices may be provided.

According to various embodiments, devices and/or methods and/or software and/or applications (in other words: apps) may be provided.

It will be understood that although some embodiments are described with respect to a mobile phone (or smart phone), energy management according to various embodiments is not limited to mobile phones or smart phones, but may be provided for any kind of device which needs battery power.

The following examples pertain to further embodiments.

Example 1 is an energy monitoring method comprising: determining internal energy information indicating a charge state of an internal battery of a computing device; wirelessly receiving external energy information indicating a charge state of an external battery for the computing device; determining a combined energy information indicating a combined charge state of the internal battery and external battery based on the internal energy information and based on the external energy information; and providing a notification to a user of the computing device based on the combined energy information.

In example 2, the subject-matter of example 1 can optionally include determining based on the combined energy a remaining time information indicating a remaining run time during which the internal battery and the external battery provide energy to the computing device.

In example 3, the subject-matter of example 2 can optionally include setting a battery life reserve time indicating a desired duration for which the internal battery and the external battery are to provide energy to the computing device.

In example 4, the subject-matter of example 3 can optionally include determining whether the remaining run time is shorter than the desired duration.

In example 5, the subject-matter of example 4 can optionally include providing a warning notification to the user of the computing device if the sufficiency determination circuit determines that the remaining run time is shorter than the desired duration.

In example 6, the subject-matter of any one of examples 1 to 5 can optionally include determining a daily time at which usually the user starts charging of at least one of the external battery or the internal battery.

In example 7, the subject-matter of example 6 can optionally include setting, based on the daily time at which usually the user starts the charging, a battery life reserve time indicating a desired duration for which the internal battery and the external battery are to provide energy to the computing device.

In example 8, the subject-matter of any one of examples 1 to 7 can optionally include determining a daily time at which usually the user ends charging of at least one of the external battery or the internal battery.

In example 9, the subject-matter of any one of examples 1 to 8 can optionally include determining a history of power consumption over pre-determined periods of a day.

In example 10, the subject-matter of example 9 can optionally include setting, based on the history, a battery life reserve time indicating a desired duration for which the internal battery and the external battery are to provide energy to the computing device.

In example 11, the subject-matter of any one of examples 1 to 10 can optionally include that the external battery is provided in a battery pack.

In example 12, the subject-matter of any one of examples 1 to 11 can optionally include that the energy monitoring method is carried out in the computing device.

In example 13, the subject-matter of any one of examples 1 to 12 can optionally include that the computing device is a smart phone.

In example 14, the subject-matter of any one of examples 1 to 13 can optionally include that the energy monitoring method is carried out in a device separate from the computing device.

In example 15, the subject-matter of any one of examples 1 to 14 can optionally include that the energy monitoring method is carried out in a wearable device.

Example 16 is a battery device comprising: a battery, wherein the battery is the external battery from which the external energy information is received wirelessly in the energy monitoring method according to any one of examples 1 to 15; and a wireless transmitter configured to wirelessly transmit the external energy information.

Example 17 is a battery device comprising: a battery; a wireless transmitter configured to wirelessly transmit external energy information indicating a charge state of the battery to a computing device; and a power connector configured to provide energy from the battery to the computing device.

In example 18, the subject-matter of example 17 can optionally include a remaining time determination circuit configured to determine a remaining time information indicating a remaining run time during which the battery provides energy to the computing device.

In example 19, the subject-matter of example 18 can optionally include a reserve setting circuit configured to set a battery life reserve time indicating a desired duration for which the battery is to provide energy to the computing device.

In example 20, the subject-matter of example 19 can optionally include a sufficiency determination circuit configured to determine whether the remaining run time is shorter than the desired duration.

In example 21, the subject-matter of example 20 can optionally include a notification circuit configured to provide a warning notification to the user of the computing device if the sufficiency determination circuit determines that the remaining run time is shorter than the desired duration.

In example 22, the subject-matter of any one of examples 17 to 21 can optionally include a standard charging start time determination circuit configured to determine a daily time at which usually the user starts charging of the battery.

In example 23, the subject-matter of example 22 can optionally include a reserve setting circuit configured to set, based on the daily time at which usually the user starts the charging, a battery life reserve time indicating a desired duration for which the battery is to provide energy to the computing device.

In example 24, the subject-matter of any one of examples 17 to 23 can optionally include a standard charging end time determination circuit configured to determine a daily time at which usually the user ends charging of battery.

In example 25, the subject-matter of any one of examples 17 to 24 can optionally include a daily usage intensity determination circuit configured to determine a history of power consumption over pre-determined periods of a day.

In example 26, the subject-matter of example 25 can optionally include a reserve setting circuit configured to set, based on the history, a battery life reserve time indicating a desired duration for which the battery is to provide energy to the computing device.

In example 27, the subject-matter of any one of examples 17 to 26 can optionally include that the battery device is provided separate from the computing device.

In example 28, the subject-matter of any one of examples 17 to 27 can optionally include that the power connector comprises a universal serial bus connector.

Example 29 is a computer-readable medium comprising program instructions which when executed by a processor cause the processor to perform the energy monitoring method of any one of examples 1 to 15.

Example 30 is a server comprising a downloadable program which comprises program instructions which when downloaded and executed by a processor cause the processor to perform the energy monitoring method of any one of examples 1 to 15.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An energy monitoring method comprising:
   determining internal energy information indicating a charge state of an internal battery of a computing device;
   wirelessly receiving external energy information from an external battery, the external energy information indicating a charge state of the external battery for the computing device;
   determining a combined energy information indicating a combined charge state of the internal battery and external battery based on the internal energy information and based on the external energy information;
   determining based on the combined energy a remaining time information indicating a remaining run time during which the internal battery and the external battery provide energy to the computing device;
   learning a user's pattern of charging the computing device to predict a future charging time of the computing device; and
   providing a notification to the user in response to determining the remaining run time will end before the predicted future charging time.

2. The energy monitoring method of claim 1, further comprising:
   setting a battery life reserve time indicating a desired duration for which the internal battery and the external battery are to provide energy to the computing device.

3. The energy monitoring method of claim 1, further comprising:
   determining a daily time at which usually the user starts charging of at least one of the external battery or the internal battery.

4. The energy monitoring method of claim 1, further comprising:
   determining a daily time at which usually the user ends charging of at least one of the external battery or the internal battery.

5. The energy monitoring method of claim 1, further comprising:
   determining a history of power consumption over pre-determined periods of a day.

6. The energy monitoring method of claim 1,
   wherein the external battery is provided in a battery pack.

7. The energy monitoring method of claim 1,
   wherein the energy monitoring method is carried out in the computing device.

8. The energy monitoring method of claim 1,
   wherein the computing device is a smart phone.

9. The energy monitoring method of claim 1,
   wherein the energy monitoring method is carried out in a device separate from the computing device.

10. The energy monitoring method of claim 1,
    wherein the energy monitoring method is carried out in a wearable device.

11. A server comprising a downloadable program which comprises program instructions which when downloaded and executed by a processor cause the processor to perform the energy monitoring method, the method comprising:
    determining internal energy information indicating a charge state of an internal battery of a computing device;
    wirelessly receiving external energy information from an external battery, the external energy information indicating a charge state of the external battery for the computing device;
    determining a combined energy information indicating a combined charge state of the internal battery and external battery based on the internal energy information and based on the external energy information;
    determining based on the combined energy a remaining time information indicating a remaining run time during which the internal battery and the external battery provide energy to the computing device;
    learning a user's pattern of charging the computing device to predict a future charging time of the computing device; and
    providing a notification to the user in response to determining that the remaining run time will end before the predicted future charging time.

12. The energy monitoring method of claim 2, further comprising:
   alerting the user if the remaining run time is less than the desired duration.

13. The server of claim 11, further comprising:
   determining a daily time at which usually the user starts charging of at least one of the external battery or the internal battery.

14. The server of claim 11, further comprising: determining a daily time at which usually the user ends charging of at least one of the external battery or the internal battery.

15. The server of claim 11, further comprising:
   determining a history of power consumption over predetermined periods of a day.

16. The server of claim 11, wherein the energy monitoring method is carried out in a device separate from the computing device.

* * * * *